United States Patent [19]

Brenneman

[11] 4,329,701
[45] May 11, 1982

[54] SEMICONDUCTOR PACKAGE

[75] Inventor: Daniel A. Brenneman, La Crosse, Wis.

[73] Assignee: The Trane Company, La Crosse, Wis.

[21] Appl. No.: 888,116

[22] Filed: Mar. 20, 1978

[51] Int. Cl.³ .................... H01L 29/34; H01L 23/28; H01L 23/02
[52] U.S. Cl. .................... 357/28; 357/52; 357/72; 357/74; 357/68; 29/588
[58] Field of Search .............. 357/28, 52, 55, 72, 357/74, 68; 29/588

[56] References Cited

U.S. PATENT DOCUMENTS

| | | | |
|---|---|---|---|
| 2,758,263 | 8/1956 | Robillard | 357/72 |
| 2,809,332 | 10/1957 | Sherwood | 357/72 |
| 2,946,935 | 7/1960 | Finn | 357/72 |
| 3,094,765 | 6/1963 | Willecke | 29/588 |
| 3,182,201 | 5/1965 | Skiar | 357/28 |
| 3,200,310 | 8/1965 | Carman | 357/28 |
| 3,320,495 | 5/1967 | Fox et al. | 357/72 |
| 3,328,650 | 6/1967 | Boyer | 357/74 |
| 3,476,988 | 11/1969 | Zido | 357/72 |
| 3,496,427 | 2/1970 | Lee | 357/72 |
| 3,600,650 | 8/1971 | Obenhaus | 357/28 |

*Primary Examiner*—Andrew J. James
*Attorney, Agent, or Firm*—Carl M. Lewis; Peter D. Ferguson; Ronald M. Anderson

[57] ABSTRACT

An improved semiconductor package is disclosed wherein a semiconductor wafer assembly includes first and second generally planar surfaces having respective first and second membrane members in overlying relationship thereto. Encompassing the periphery of the wafer assembly is a mass of retaining material, such as epoxy resin, which may overlie outer edge portions of the wafer assembly and sealingly engage the first and second membrane members. In a preferred embodiment, the semiconductor wafer assembly comprises a thyristor having a gate associated therewith having conductor means attached thereto which are embedded in a suitable layer of adhesive material which is disposed between the wafer assembly and the mass of retaining material. Another feature of the invention includes the provision of a temperature sensing element, such as a thermistor, which is disposed in intimate heat exchange relationship to the wafer assembly so as to accurately sense its operating temperature. In order to provide such heat exchange relationship, the element is preferably disposed between one of the planar surfaces of the wafer assembly and its associated membrane member, which is made to conform at least partially to the outer surface of the temperature sensing element. The element is also embedded in the aforementioned layer of adhesive material and includes signal conductor means which pass through said layer and the mass of retaining material.

4 Claims, 3 Drawing Figures

SEMICONDUCTOR PACKAGE

BACKGROUND OF THE INVENTION

1. Field of the Invention

This invention relates to the field of semiconductor packaging and has special application to those semiconductor devices such as rectifiers and silicon controlled rectifiers which are designed for relatively high current applications. Such devices are used in assemblies for producing large amounts of DC current from an AC current source and also in those applications where it is necessary to switch on and off relatively large current flows to electrical machinery such as electric motors and the like.

2. Description of the Prior Art

A first general type of prior art packaged semiconductor devices is illustrated in U.S. Pat. Nos. 3,310,716 and 3,443,168. The first-mentioned patent discloses a semiconductor package wherein a wafer assembly comprising a junction member 2 and bracing plates 3 and 4 is disposed between ductile cover plates 6 and 7. Surrounding the periphery of the wafer assembly is an insulating ring 5 which may be composed of sintered aluminum oxide, which ring may be assembled in two halves, as by hard soldering or welding.

The second-mentioned patent discloses a semiconductor package wherein the wafer assembly is disposed between two diaphragm members having flange portions which project outwardly beyond the edges of the wafer assembly. A ring of epoxy resin is molded to these flanges in such a manner as to maintain the diaphragms in compressive electrical contact with the wafer assembly.

U.S. Pat. No. 3,489,957 discloses a commercially available embodiment of a packaged semiconductor. In this embodiment, a semiconductor unit 42 is disposed between relatively massive metal studs 12 and 14. Connected to these studs and encompassing the periphery of the semiconductor unit is a combined ceramic/metallic assembly specially constructed so as to accommodate relative movement within the package.

SUMMARY OF THE INVENTION

The present invention relates to an improved semiconductor package wherein a semiconductor wafer assembly of conventional design is mounted in a novel packaging arrangement for convenient use in a variety of applications. The package further includes the novel capability of accurately sensing the operating temperature of the semiconductor wafer.

The semiconductor wafer assembly itself includes first and second generally planar surfaces on its opposite sides, which surfaces are substantially parallel to each other and of approximately equal area. Overlying and contiguous to said surfaces are first and second membrane members which are constructed from electrically conductive material and which thus serve as the electrodes of the semiconductor package. A mass of insulating retaining material such as epoxy resin encompasses the periphery of the wafer assembly and is in sealing engagement with the membrane members so as to provide a sealed semiconductor package having a suitably insulated periphery. Preferably, a layer of suitable resilient adhesive material is disposed between edge portions of the wafer assembly and the mass of retaining material.

The semiconductor element itself may comprise a simple rectifier or, in the alternative, a controlled rectifier having an associated control gate. In the latter case, it is preferred that the gate lead be suitably embedded in the aforementioned layer of adhesive material at the point where it attaches to the wafer assembly.

In order to accurately monitor the operating temperature of the semiconductor wafer, a temperature sensing element such as a thermistor is disposed within the package in heat conductive relationship with the wafer. In a preferred embodiment, the sensing element is disposed between one of the planar surfaces of the wafer assembly and its associated membrane member, which may be shaped so as to conform to the outer surface of said element. In this manner, the temperature sensing element may respond rapidly and accurately to changes in the wafer operating temperature.

The mass of retaining material which encompasses the periphery of the wafer assembly may be made to overlie its outer edge portions in sealing engagement with the membrane members. In this manner, a more compact package is provided than in prior art semiconductor packages of which applicant is aware. Preferably, the overlying portions of said retaining material form circular bores having their axes perpendicular to the planar surfaces of the wafer assembly. Such bores then serve as receptacles for suitable electrical conductor elements forming components of a given installation.

Accordingly, it is an object of the present invention to provide an improved semiconductor package which may serve as a simple rectifier or a gate-controlled rectifier, which is compact in design and which includes the further capability of sensing the operating temperature of the wafer assembly.

It is a further object of the invention to provide such a semiconductor package which is less expensive to manufacture than those packages currently available on the market.

Another object of the invention is to provide a semiconductor package wherein any associated electrical connections made within the package are protected from failure by their being embedded in suitable resilient adhesive material.

A further object of the invention lies in the installation of a suitable temperature sensing element within the package at such a point as to accurately sense the operating temperature of the wafer.

Further, it is an object of the invention to provide a semiconductor package which is not only compact but also readily adaptable to installation between suitable electrical conductors in a variety of applications.

These and further objects of the invention will become apparent from the following description of a preferred embodiment and by reference to the accompanying drawings.

DESCRIPTION OF A PREFERRED EMBODIMENT

Figure 1:
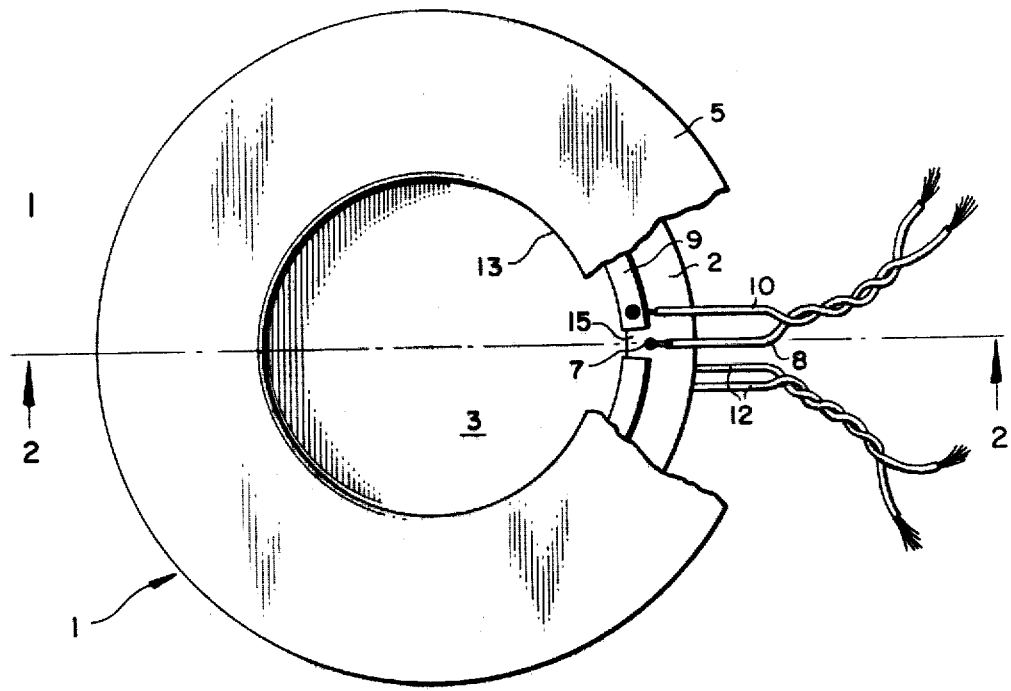
FIG. 1 is a plan view of the improved semiconductor package partially cut away so as to illustrate certain features of its construction.
Figure 2:
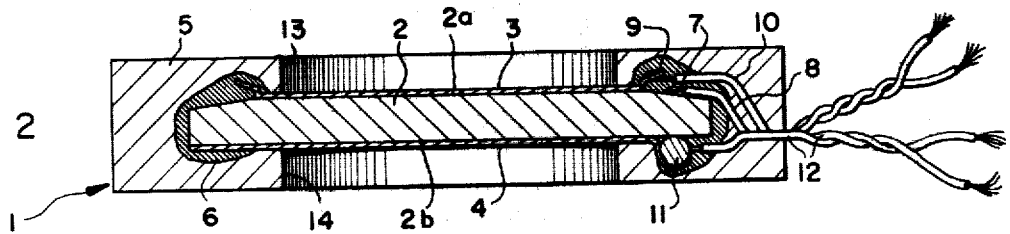
FIG. 2 is a cross-sectional view taken along the line 2—2 of FIG. 1.
Figure 3:
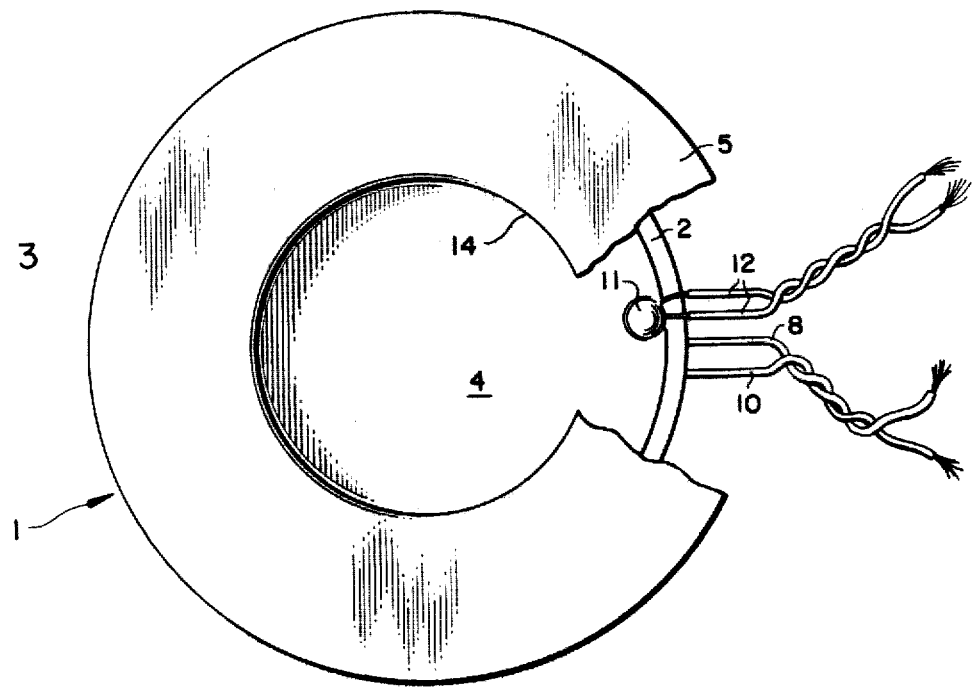
FIG. 3 is a bottom view of the semiconductor package partially cut away so as to illustrate certain features of its construction.

Turning now to FIGS. 1-3 of the drawings, the invention will be described in particularity, especially with reference to the cross-sectional view illustrated in FIG. 2.

As seen in FIG. 2, the improved semiconductor package is shown generally at 1 and includes a semiconductor wafer assembly 2 which is of conventional, commercially available construction. As is known to those skilled in the art, the wafer assembly comprises alternate layers of N and P type silicon suitably arranged and doped as to provide the desired operating characteristics. Wafer assemblies are commercially available which serve as either simple rectifiers or controlled rectifiers which are rendered conductive upon application of a voltage to its associated gate. In addition to the alternate layers of N and P type silicon, it is conventional to provide a layer of strengthening metal, such as molybdenum, to upper and lower faces of the wafer in order to impart sufficient strength and rigidity thereto.

Since details of the semiconductor wafer assembly itself are not critical to an understanding of the present invention, it is believed that the above description thereof will suffice. Reference may be had to any of the available handbooks on semiconductor theory for detailed explanation of the construction and operating characteristics of this type device.

Returning now to FIG. 2, it may be seen that wafer assembly 2 includes first and second generally planar surfaces 2a and 2b on opposite sides thereof, which surfaces are substantally parallel to each other and of approximately equal area. Although it may be noted that outer edge portions of surface 2a are slightly beveled, the descriptive term "generally planar" is intended to be broad enough to describe this configuration. It is also possible that, in lieu of a beveled outer periphery, a slight step or series of steps may be provided at that point, which construction is also intended to be encompassed within the scope of the present invention.

Functionally, surfaces 2a and 2b serve as respective cathode and anode electrodes of the semiconductor wafer. Thus, electrical current may be passed between surfaces 2a and 2b through the wafer itself when in its conductive mode. Overlying surfaces 2a and 2b are first and second membrane members 3 and 4, respectively, which members are constructed of a relatively thin, flexible, electrically conductive material. In a preferred embodiment, membrane members 3 and 4 are constructed of silver on the order of 0.002 inches thickness. As may be clearly seen in FIG. 2, membrane members 3 and 4 are contiguous to surfaces 2a and 2b, respectively, whereby their central portions may serve as electrodes for the semiconductor package.

Encompassing the periphery of wafer assembly 2 is a mass of retaining material 5 which, in a preferred embodiment, may comprise a suitable epoxy resin which is electrically insulating. Material 5 is suitably molded about the periphery of the wafer assembly and, in a preferred embodiment, overlies outer edge portions of first and second surfaces 2a and 2b, in sealing engagement with outer edge portions of first and second membrane members 3 and 4, respectively. In this manner, it may be seen that the outer periphery of the wafer assembly is protected and effectively insulated, while the central electrode portions of membrane members 3 and 4 remain accessible to suitable electrical conductors.

It is preferable that the semiconductor package be of generally circular configuration, as illustrated, which is the generally available configuration of semiconductor wafer assemblies. It is further preferred that the diameters of membrane members 3 and 4 be equal to or less than the diameter of wafer assembly 2, as shown. In this manner, an extremely compact package is provided in which retaining material 5 may actually overlie outer edge portions of the wafer assembly itself. As clearly illustrated in FIG. 2, the inner portions of retaining material 5 form first and second cylindrical bores 13 and 14, respectively, which have their axes substantially perpendicular to the respective first and second surfaces 2a and 2b. These bores serve to accept and locate suitable electrical conductors in contact with membrane members 3 and 4.

It is also preferred that a layer of resilient adhesive material be disposed between the semiconductor wafer assembly 2 and the mass of retaining material 5. Thus, layer 6 completely encircles the periphery of wafer assembly 2 and is in overlying relationship with outer edge portions of generally planar surfaces 2a and 2b.

Since the embodiment disclosed in the drawings is intended to operate as a controlled rectifier, gate 7 is provided on the outer edge portion of surface 2a and first electrical conductor means 8 are connected thereto. Preferably, the connection to gate 7 is embedded within the layer of adhesive material 6 in order to protect the connection and prevent its working loose due to vibration or other external disturbance. As seen, conductor 8 extends through the layer of adhesive material and the mass of retaining material 5 to a point external of the package where it may be connected to a suitable source of control voltage.

A further feature of the embodiment illustrated in the drawings involves the provision of an upstanding flange 9 about the periphery of first membrane member 3. A second conductor means 10 is connected to upstanding flange 9, which connection is also embedded within the layer of adhesive material 6. Conductor 10 passes through adhesive material 6 and retaining material 5 to a point external of the semiconductor package. This conductor may then serve as a cathode connection for the thyristor and be connected to associated control circuitry in conjunction with first conductor means 8.

Adhesive material 6 preferably comprises a material which retains its resiliency such as silicone.

In the operation of semiconductor devices of the type under consideration, especially those carrying relatively large current flows, the danger exists that the semiconductor may overheat, causing serious damage thereto. It is therefore desirable that means be provided for monitoring the operating temperature of the semiconductor wafer assembly during its operation.

In order to accomplish the aforementioned objective, a temperature sensing element 11 is provided within the semiconductor package at a location where it is subjected to the operating temperature of the wafer assembly. In a preferred embodiment, as illustrated in the drawings, temperature sensing element 11 is disposed between planar surface 2b and its associated membrane member 4. The preferred temperature sensing element comprises a thermistor (e.g., a resistor whose resistance changes with temperature) having a generally spherical shape.

In order that thermistor 11 accurately and rapidly sense temperature changes of wafer assembly 2, it is not only disposed immediately adjacent thereto, but second membrane member 4 is shaped so as to conform to the outer surface of the thermistor. In this manner, a direct path of heat conduction is provided by way of membrane member 4 to the surface of the thermistor. As will be appreciated, the electrically conductive material of which membrane member 2 is constructed also exhibits excellent heat conductive properties. This particular feature of the invention is considered of great importance and it is possible that suitable results could be achieved by having the thermistor in contact only with one of the membrane members at a location not contiguous with the wafer assembly itself.

As shown most clearly in FIGS. 2 and 3, membrane member 4 surrounds the surface of thermistor 11 so as to be in contact with at least 50% of its total surface area.

It is also preferable that thermistor 11 be at least partially embedded within resilient adhesive material 6, especially at the point where its associated signal conductor means 12 attach thereto, thereby affording protection of these relatively delicate junctions. Once again, signal conductor means 12 pass through layer 6 of adhesive material and the mass of retaining material 5 to a point external of the semiconductor package for connection to suitable temperature monitoring circuitry.

In lieu of a thermistor as the temperature sensing element, equivalent sensing devices such as a thermocouple may be substituted therefor.

Although upstanding flange 9 is illustrated in the drawings as extending about substantially the entire periphery of first membrane member 3, having only a slight gap at 15 to avoid contact with gate conductor means 8, it would be within the scope of the present invention to provide but a single, relatively short upstanding flange for connection to second conductor means 10.

From the above description of a preferred embodiment, it will be apparent that applicant has disclosed a novel, improved semiconductor package which meets the aforementioned objects of the invention. While the invention has been described with respect to a preferred embodiment, it is to be understood that modifications thereto will be apparent to those skilled in the art within the scope of the invention, as defined in the claims which follow.

I claim:

1. A semiconductor package comprising:
   a. a semiconductor wafer assembly having first and second generally planar surfaces on opposite sides thereof, said surfaces being substantially parallel to each other and of approximately equal area, the outer edge portions of said surfaces lying substantially opposite each other so as to define the periphery of said semiconductor wafer assembly, at least the central portions of said surfaces being electrically conductive and defining electrodes of said semiconductor wafer assembly;
   b. first and second membrane members in overlying, contiguous relationship to said respective first and second generally planar surfaces, said members being constructed of electrically conductive material;
   c. a mass of retaining material encompassing the periphery of said semiconductor wafer assembly and sealingly engaging outer edge portions of said first and second membrane members, said retaining material being electrically insulating whereby the edge portions of said semiconductor package are effectively sealed and electrically insulated while central portions of said first and second membrane members remain exposed for use as electrodes of said semiconductor package; and
   d. a temperature sensing element capable of producing an electrical signal related to its temperature, said element being disposed adjacent a peripheral portion of said wafer assembly in heat conductive relation thereto between one of said generally planar surfaces and its associated membrane member, said membrane member at least partially conforming to the shape of said element so as to be in intimate heat exchange contact therewith, whereby changes in the operating temperature of said semiconductor wafer assembly are rapidly and accurately sensed by said element; said peripheral portion being encompassed by said retaining material, and further comprising signal conductor means connected to said temperature sensing element and passing through said mass of retaining material to a point external of said package, whereby the operating temperature of said semiconductor wafer assembly may be monitored.

2. The semiconductor package of claim 1 wherein said temperature sensing element comprises a thermistor having a generally spherical shape and wherein said associated membrane member conforms to contact at least one-half of its surface area.

3. The semiconductor package of claim 1 further comprising a layer of resilient adhesive material disposed between said semiconductor wafer assembly and said mass of retaining material and at least partially surrounding said temperature sensing element, said signal conductor means being surrounded thereby at the point where said means connects to said element.

4. The semiconductor package of claim 1 wherein the outer peripheries of said semiconductor wafer assembly and said first and second membrane members are substantially circular, the diameters of said members being less than or equal to that of said semiconductor wafer assembly, said mass of retaining material overlying the outer edge portions of said first and second generally planar surfaces to form first and second cylindrical bores having their respective axes substantially perpendicular to said first and second generally planar surfaces, said bores being adapted to receive electrical conductors.

* * * * *